United States Patent [19]
Chayahara et al.

[11] Patent Number: 6,039,847
[45] Date of Patent: Mar. 21, 2000

[54] METHOD OF FORMING A HIGHLY PURE THIN FILM AND APPARATUS THEREFOR

[75] Inventors: Akiyoshi Chayahara; Yuji Horino; Atsushi Kinomura; Nobuteru Tsubouchi; Kanenaga Fujii, all of Ikeda, Japan

[73] Assignee: Agency of Industrial Science & Technology, Tokyo, Japan

[21] Appl. No.: 09/041,099

[22] Filed: Mar. 12, 1998

[30] Foreign Application Priority Data

Jun. 23, 1997 [JP] Japan ............................ 9-183109

[51] Int. Cl.[7] .................................................. C23C 14/34
[52] U.S. Cl. ............................ 204/192.11; 250/423 R
[58] Field of Search ..................... 204/192.11, 298.04; 250/423 R

[56] References Cited

U.S. PATENT DOCUMENTS

| 2,816,243 | 12/1957 | Herb et al. ............................. 313/63 |
| 3,617,789 | 11/1971 | Middleton et al. .................... 313/63 |
| 4,980,556 | 12/1990 | O'Connor et al. ................. 250/423 R |
| 5,178,738 | 1/1993 | Ishikawa et al. ................. 204/192.11 |
| 5,365,070 | 11/1994 | Anderson et al. ................. 250/423 R |
| 5,466,941 | 11/1995 | Kim .................................. 250/423 R |

*Primary Examiner*—Nam Nguyen
*Assistant Examiner*—Steven H. VerSteeg
*Attorney, Agent, or Firm*—Arent Fox Kintner Plotkin & Kahn, PLLC

[57] ABSTRACT

A material of ions is sputtered with cesium ions to generate negative ions and, the negative ions are accelerated and mass-separated to obtain a negative ion beam, and a material of thin film is sputtered with the negative ion beam, thereby forming a thin film on a base material.

8 Claims, 2 Drawing Sheets

METHOD OF FORMING A HIGHLY PURE THIN FILM AND APPARATUS THEREFOR

BACKGROUND OF THE INVENTION

The present invention relates to a novel method for forming a highly pure thin film based upon an ion beam sputtering method and to an apparatus therefor.

As the process for producing semiconductors is becoming more sophisticated in recent years, it has been strongly demanded to prevent the reaction on the interface and to prevent the diffusion of dopant, in order to obtain precise and steep dopant distributions. To satisfy this demand, it becomes necessary to grow a thin film at a low temperature and to establish technology capable of effecting the doping at a temperature as low as possible.

A temperature of not lower than 1000° C. is usually required for growing an epi-layer of silicon based on the chemical vapor deposition method (CVD). At such a high temperature, the diffusion of the dopant becomes no longer negligible, as a matter of course. In order to lower the growing temperature in the CVD method, technologies have been developed such as ultra-high vacuum CVD (UHVCVD) and low-pressure CVD (LPCVD). Even relying upon these technologies, however, the growing temperature is not low enough. In order to obtain a steep dopant distribution, the growing temperature must be further lowered.

In the light-assisted CVD, the growth of epi-layer at a temperature of not higher than 200° C. has been reported without, however, still being capable of suppressing lattice defect, transition, etc. to a satisfactory degree. On the other hand, a molecular beam epitaxial growing method (MBE) has been known as an excellent low-temperature growing method. This method, however, is not capable of easily depositing silicon.

An ion beam direct deposition method is capable of growing an epi-layer at a low temperature, but is not capable of easily irradiating an ion beam of low energy in very high degree of vacuum due to the limitation on the deceleration system or on the source of generating ions.

A sputtering method can be applied for forming a thin silicon film of a device grade at a low temperature. This method is advantageous from the standpoint of suppressing impurities since less gases are produced from the source of vaporization unlike that of heated vaporization. In particular, use of the ion beam sputtering method makes it possible to grow an epi-layer at a low temperature in a high degree of vacuum.

When Kr ions or Ar ions are used for sputtering in the ion beam sputtering method, however, there arises a problem in that these ions are entrapped in the thin film, particularly, in a low-temperature zone though the amounts are smaller than those of the plasma sputtering method. In other words, the problem is that gaseous elements flying into the material from ion sources from where ions are generated and ions themselves infiltrate into the thin film.

Concerning this according to the existing technology, use is made of a combination of a high-vacuum pump called differential evacuating device and a partitioning wall in plural stages between the source of ions and the chamber for forming a thin film, in order to prevent their infiltration and to highly evacuate the interior of the chamber for forming a thin film. Despite the differential evacuating device is installed, however, it is still difficult to completely prevent the entrapping of ions. Not only this, it becomes necessary to limit the diameter of the ion beam and, besides, the apparatus as a whole becomes bulky and complex.

BRIEF SUMMARY OF THE INVENTION

The object of the present invention is to provide a method of easily producing a highly pure thin film and an apparatus therefor.

That is, the present invention is concerned with a method of forming a thin film by ion beam sputtering, wherein a starting material of ions is sputtered with cesium ions to generate negative ions and, the negative ions are accelerated and mass-separated to obtain a negative ion beam, and a starting material of thin film is sputtered with the negative ion beam thereby to form a thin film on a base material.

The present invention is further concerned with an apparatus for forming a thin film by ion beam sputtering, wherein, as a negative ion-generating device, use is made of a cesium-sputtered negative ion-generating means for generating negative ions by sputtering the starting material of ions with cesium ions.

According to the present invention, first, a cesium vapor is brought into contact with a high-temperature surface so as to be ionized, and is then accelerated to come into collision with a substance (target=material of ions) containing object ions. Negative ions generated at this moment are taken out, and are accelerated to form a negative ion beam. In this case, the cesium vapor is not only ionized for sputtering, but is also absorbed by the target surface (usually cooled at about room temperature) that is to be sputtered making it possible to increase the ratio of negative ions in the particles released by sputtering. When no cesium exists on the target surface, most of the sputtered particles are neutral or positive ions. According to the present invention as described above, the feature resides in that no element is used other than cesium and, particularly, no gaseous element is used. This makes it possible to realize a high degree of vacuum.

DETAILED DESCRIPTION OF THE INVENTION

Figure 1:
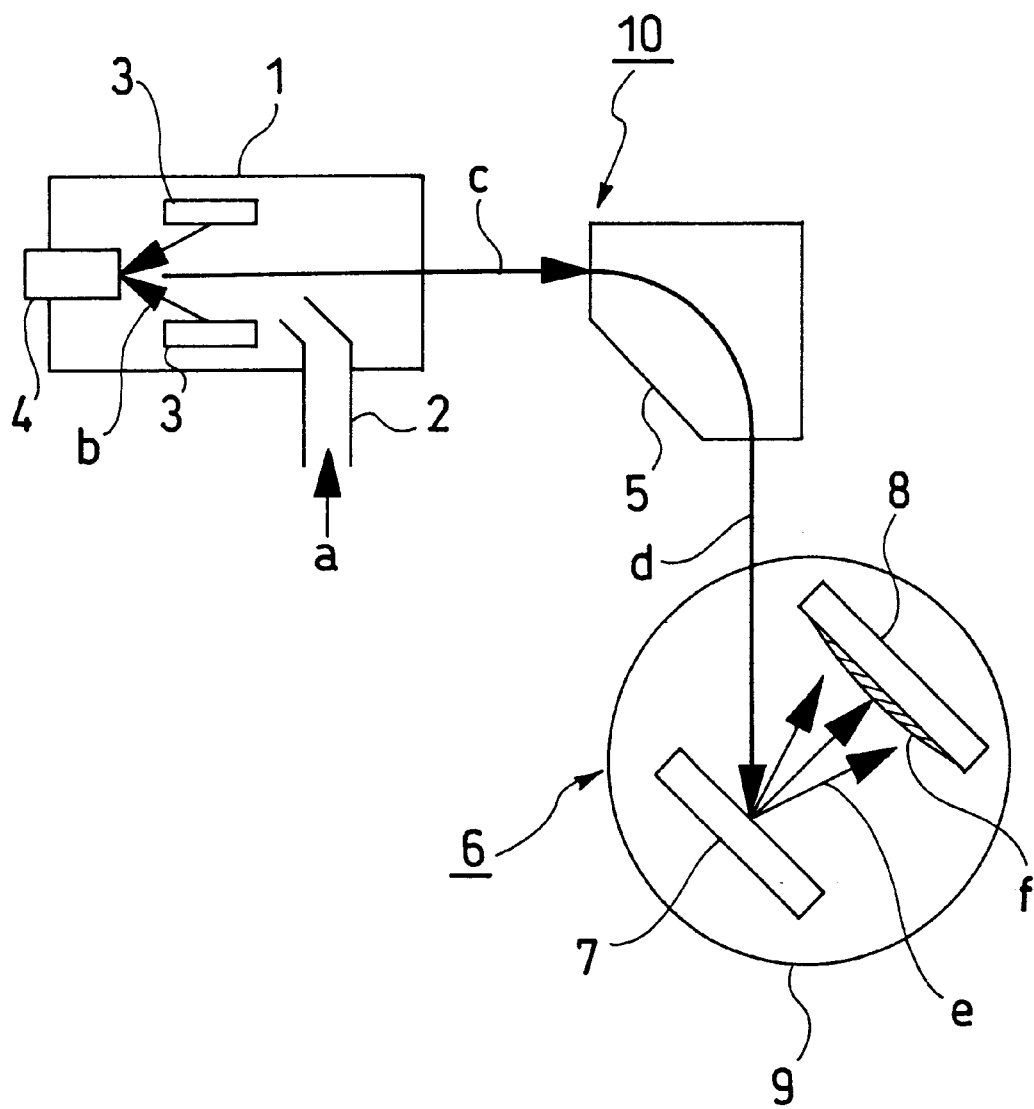
FIG. 1 is a diagram schematically illustrating an apparatus for forming a highly pure thin film according to the present invention.

Referring to FIG. 1, a device 10 for forming a thin film by ion beam sputtering in high vacuum is constituted by an ion-generating device 1, an ion-refining device 5, and a thin film-forming device 6.

The ion-generating device 1 has an introduction port 2 for introducing a cesium vapor a. In the ion-generating device 1 are installed a metal member 3 heated at a high temperature, a material 4 of ions, and a cesium-sputtered negative ion-generating source (not shown). The interior of the ion-generating device 1 is maintained in a predetermined degree of vacuum.

Negative ions c generated in the ion-generating device 1 are converted into a negative ion beam d by the ion-refining device 5 prior to sputtering a material 7 of thin film in the thin film-forming device 6. The ion-refining device 5 is equipped with an accelerating device and a mass-separating device.

The thin film-forming device 6 is equipped with the material 7 of thin film that will be irradiated with a negative ion beam d and a base material 8 at an opposing electrode. As the material 7 of thin film is sputtered with the negative ion beam d, the sputtered particles e flying therefrom deposit on the base material 8 to form a thin film f. The thin film-forming device 6 is hermetically closed by a high vacuum container 9, and the interior thereof is maintained in a predetermined degree of vacuum.

In the present invention, first, cesium ions b are generated from the cesium vapor a before the material 4 of ions is sputtered with cesium ions b. In order to generate the cesium ions b, the cesium vapor a is introduced into the ion beam-generating device 1 and is brought into contact with the metal member 3 that has been heated at a high temperature, so that cesium ions b are thermally ionized on the surface of the metal and are generated.

In this case, the cesium vapor a is introduced usually under a heated condition at 160 to 210° C. There is no limitation on the metal member so far as the cesium vapor can be thermally ionized. Particularly, however, it is desired to use tantalum or tungsten. Cesium is thermally ionized, usually, at a temperature of 1000 to 1100° C.

Then, by using cesium ions b generated by the thermal ionization, the material 4 of ions is sputtered to generate negative ions c.

There is no particular limitation on the materials of ions provided they generate negative ions. The material can be selected from, for example, metals such as silicon, carbon, gold, silver, copper, nickel, platinum, boron, MgO, CuCl, NaCl, $Al_2O_3$, $Fe_2O_3$, CoO, TiH, $TiO_2$, as well as from non-metals, or oxides thereof or chlorides thereof. They may be used in one kind or in two or more kinds.

As a means for sputtering the material 4 of ions with cesium ions c, there can be used, for example, the one that has been developed for a high-energy ion accelerator (tandem accelerator). The sputtering conditions may be suitably set depending upon the kinds of the material of ions that is used. It is desired that the atmosphere for generating negative ions has a degree of vacuum which is as low as possible and, usually, not higher than $1 \times 10^{-6}$ Torr and, desirably, from $1 \times 10^{-7}$ to $9 \times 10^{-7}$ Torr.

Negative ions c generated by sputtering are accelerated and mass-separated to obtain a negative ion beam d prior to sputtering the material 7 of thin film. The acceleration is effected by applying a negative voltage to the source of generating ions and, usually, a negative voltage of not higher than 100 KeV and, preferably, from about 10 to about 100 KeV for producing a negative ion beam. In the case of silicon (Si), the voltage will be about 20 KeV. The mass-separation is effected in accordance with a known method by using, for example, an analytical electromagnet.

Next, the material 7 is sputtered with the negative ion beam d, and a thin film f is deposited and formed on the base material 8 provided at a predetermined position. The degree of vacuum in the atmosphere for forming thin film is usually not higher than $1 \times 10^{-8}$ Torr, preferably, from $1 \times 10^{-9}$ to $1 \times 10^{-10}$ Torr, and more preferably from $1 \times 10^{-10}$ to $1 \times 10^{-11}$ Torr.

The material of thin film may be any one of a metal, a non-metal, a semiconductor or a metal oxide. Furthermore, the materials of thin film may be used in a single kind or in two or more kinds as a mixture. As a material of thin film, for example, there is used a mixture of silicon carbide or silicon and carbon, and the mixture is sputtered with a negative ion beam of silicon or carbon thereby to obtain a thin film of silicon carbide on the base material. Or, a metal and an oxide may be sputtered with a negative ion beam of oxygen to form a thin film of an oxide. Thus, a variety of thin films can be formed based on the combination of a negative ion beam and a material of thin film.

According to the present invention, furthermore, when the starting material of thin film is sputtered with a negative ion beam of the same element as the material of thin film, it is allowed to synthesize a thin film without substantially containing impurities except the residual gas. For example, when the silicon (Si) is sputtered with a negative ion beam of silicon (Si), there can be obtained a thin film of silicon of a high purity.

As the base material for use in the present invention, furthermore, there can be used any material without any limitation provided it can withstand a high degree of vacuum in the atmosphere for forming thin film, i.e., provided it does not emit gas in vacuum. For example, there can be suitably used silicon, carbon, any other metal, ceramics or glass depending upon the degree of vacuum.

As described above, the present invention uses a negative ion beam generated by cesium ions, and makes it possible to accomplish a high degree of vacuum in an atmosphere for forming thin film. That is, unlike the prior art, no gaseous element is used, and no differential evacuating device is required. Since the infiltration of impurities is reliably avoided, it is allowed to synthesize a thin film of a higher purity. In particular, if the material of thin film is sputtered with the negative ion beam of the same element as the material of thin film, it is made possible to synthesize a thin film having a higher purity. Since a high degree of vacuum is realized, the thin film is formed requiring a small amount of energy in a low-temperature range, offering advantage from the standpoint of cost.

According to the present invention as described above, the thin film of a high purity is easily prepared. Thus, the present invention can be effectively utilized for the formation of, for example, a single crystalline thin film, a metallic thin film for wiring, and the like film in a process for producing semiconductors.

The feature of the present invention will become more obvious from the following Example.

EXAMPLE 1

A thin film of silicon was formed on a base material by using a high vacuum ion beam-sputtering thin film-forming device shown in FIG. 1.

Silicon was used as a material of ions, and a negative ion beam of silicon (energy of 17 KeV, current of 10 to 100 $\mu$A) was generated from a cesium-sputtered ion-generating source.

The material of silicon (wafer for forming a semiconductor) which is a material of thin film was sputtered with the negative ion beam of silicon to deposit a thin film of silicon on a base material of carbon.

Figure 2:
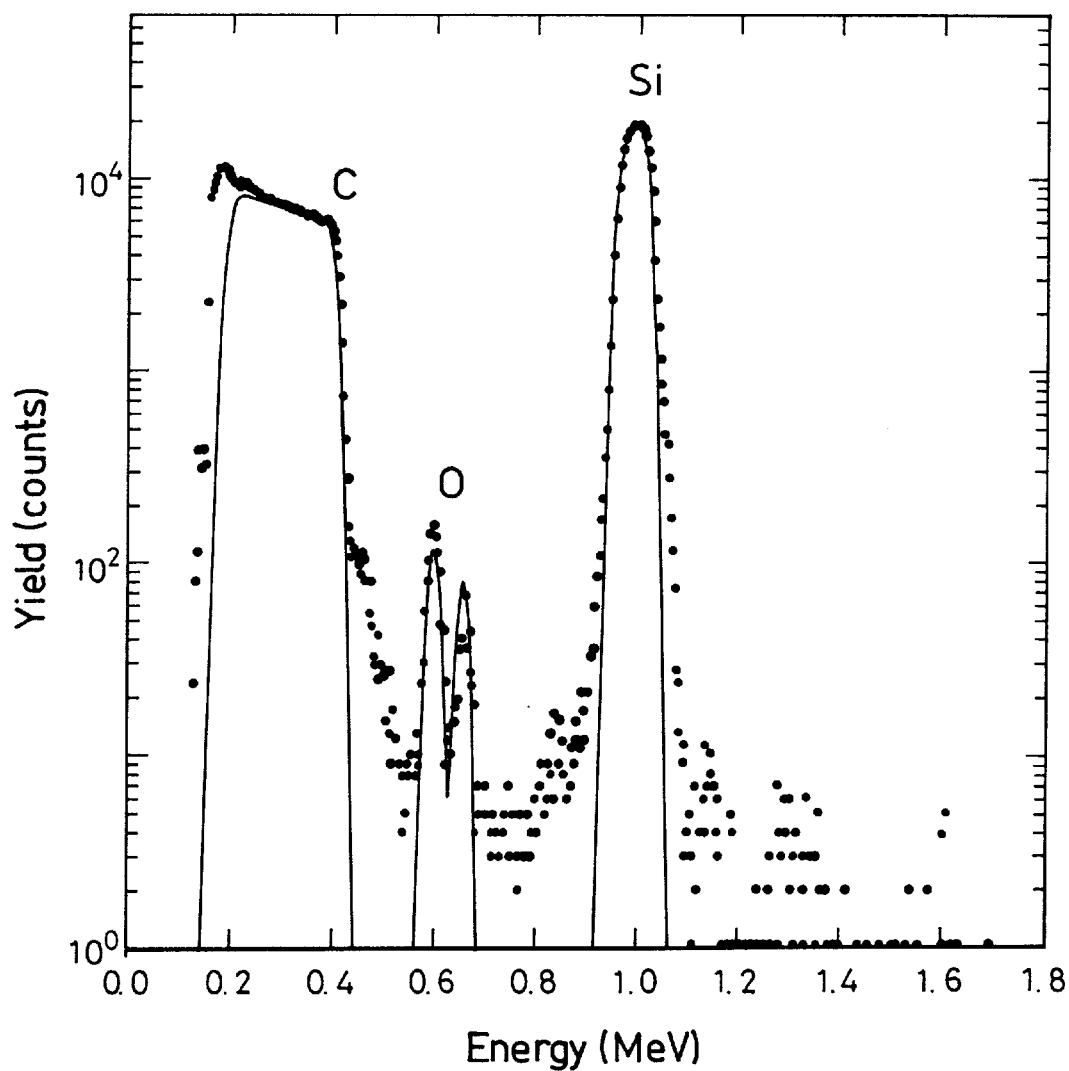
FIG. 2 is a diagram illustrating a spectrum of Rutherford back scattering of a thin silicon film deposited on a carbon base material.

The thin film of silicon thus obtained was measured for its impurities by the Rutherford back scattering method. The results were as shown in FIG. 2 wherein solid lines represent calculated values. From the results of measurement, it was learned that the obtained thin film of silicon possessed a silicon purity of not lower than 99.99%.

From FIG. 2, furthermore, it was learned that oxygen was existing in the interface between the base material and the thin film and on the surface of the thin film. Oxygen in the interface could be easily removed by the treatment of the base material.

The degree of vacuum was set at $10^{-7}$ Torr in the ion-generating device and at $10^{-9}$ Torr in the thin film-forming device.

What is claimed is:

1. A method of forming a thin film by ion beam sputtering, comprising the following steps:
(a) sputtering a material of ions with cesium ions to generate negative ions, wherein the cesium ions are generated by thermally ionizing a cesium vapor at a temperature of from 1000° C. to 1100° C.,
(b) accelerating and mass-separating the negative ions to obtain a negative ion beam, and
(c) sputtering a starting material of thin film with said negative ion beam thereby to form a thin film on a base material.

2. A method of forming a thin film according to claim 1, wherein the negative ion beam has energy which is not larger than 100 KeV.

3. A method of forming a thin film according to claim 1, wherein the negative ion beam has energy of from 10 to 100 KeV.

4. A method of forming a thin film according to claim 1, wherein step (a) is conducted in a vacuum of not higher than $1 \times 10^{-6}$ Torr.

5. A method of forming a thin film according to claim 1, wherein step (a) is conducted in a vacuum from $1 \times 10^{-7}$ to $9 \times 10^{-7}$ Torr.

6. A method of forming a thin film according to claim 1, wherein step (c) is conducted in a vacuum not higher than $1 \times 10^{-8}$ Torr.

7. A method of forming a thin film according to claim 1, wherein step (c) is conducted in a vacuum from $1 \times 10^{-7}$ to $1 \times 10^{-10}$ Torr.

8. A method of forming a thin film according to claim 1, wherein step (c) is conducted in a vacuum from $1 \times 10^{-10}$ to $1 \times 10^{-11}$ Torr.

* * * * *